US009362148B2

(12) United States Patent
Willwerth et al.

(10) Patent No.: US 9,362,148 B2
(45) Date of Patent: Jun. 7, 2016

(54) SHIELDED LID HEATER ASSEMBLY

(71) Applicants: Michael D. Willwerth, Campbell, CA (US); David Palagashvili, Mountain View, CA (US); Valentin N. Todorow, Palo Alto, CA (US); Stephen Yuen, Santa Clara, CA (US)

(72) Inventors: Michael D. Willwerth, Campbell, CA (US); David Palagashvili, Mountain View, CA (US); Valentin N. Todorow, Palo Alto, CA (US); Stephen Yuen, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 470 days.

(21) Appl. No.: 13/793,501

(22) Filed: Mar. 11, 2013

(65) Prior Publication Data

US 2013/0189848 A1 Jul. 25, 2013

Related U.S. Application Data

(62) Division of application No. 12/408,348, filed on Mar. 20, 2009, now Pat. No. 8,419,893.

(60) Provisional application No. 61/038,510, filed on Mar. 21, 2008.

(51) Int. Cl.

| | |
|---|---|
| ***H01L 21/306*** | (2006.01) |
| ***C23C 16/00*** | (2006.01) |
| ***H01L 21/67*** | (2006.01) |
| ***H01J 37/32*** | (2006.01) |
| ***H05B 6/10*** | (2006.01) |

(52) U.S. Cl.

CPC ..... *H01L 21/67069* (2013.01); *H01J 37/32321* (2013.01); *H01J 37/32522* (2013.01); *H01J 37/32623* (2013.01); *H01L 21/67017* (2013.01); *H05B 6/108* (2013.01)

(58) Field of Classification Search

CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183

USPC ....... 118/723 I, 723 IR, 723 AN; 156/345.48, 156/345.49; 315/111.51

See application file for complete search history.

(56) References Cited

U.S. PATENT DOCUMENTS

| | | | | |
|---|---|---|---|---|
| 6,006,694 | A * | 12/1999 | DeOrnellas | C23C 14/564 118/723 AN |
| 6,149,760 | A * | 11/2000 | Hama | H05H 1/46 156/345.37 |
| 6,177,646 | B1 * | 1/2001 | Okumura | H01J 37/321 156/345.37 |
| 2001/0019048 | A1 * | 9/2001 | Ose | H05B 3/141 219/463.1 |
| 2003/0213434 | A1 * | 11/2003 | Gondhalekar | C23C 16/507 118/724 |
| 2008/0236493 | A1 * | 10/2008 | Sakao | H01J 37/32091 118/723 I |

* cited by examiner

*Primary Examiner* — Luz Alejandro Mulero

(74) *Attorney, Agent, or Firm* — Patterson & Sheridan, LLP

(57) ABSTRACT

A shielded lid heater lid heater suitable for use with a plasma processing chamber, a plasma processing chamber having a shielded lid heater and a method for plasma processing are provided. The method and apparatus enhances positional control of plasma location within a plasma processing chamber, and may be utilized in etch, deposition, implant, and thermal processing systems, among other applications where the control of plasma location is desirable. In one embodiment, a shielded lid heater is provided that includes an aluminum base and RF shield sandwiching a heater element.

15 Claims, 8 Drawing Sheets

SHIELDED LID HEATER ASSEMBLY

CROSS-REFERENCE TO RELATED APPLICATION

This application is a divisional of U.S. patent application Ser. No. 12/408,348 filed Mar. 20, 2009 which claims benefit of U.S. Provisional Application Ser. No. 61/038,510 filed Mar. 21, 2008, both of which are incorporated by reference in their entireties.

BACKGROUND

1. Field

Embodiments of the present invention generally relate to semiconductor substrate processing systems. More specifically, the invention relates to a shielded lid heater assembly for a plasma processing system.

2. Background

In manufacture of integrated circuits, precise control of various process parameters is required for achieving consistent results within a substrate, as well as the results that are reproducible from substrate to substrate. As the geometry limits of the structures for forming semiconductor devices are pushed against technology limits, tighter tolerances and precise process control are critical to fabrication success. However, with shrinking geometries, precise critical dimension and etch process control has become increasingly difficult.

Many semiconductor devices are processed in the presence of a plasma. If the plasma is not uniformly positioned over the substrate, processing results may also by non-uniform.

Although conventional plasma processing chambers have proven to be robust performers at larger critical dimensions, existing techniques for controlling the plasma uniformity are one area where improvement in plasma uniformity will contribute to the successful fabrication of next generation, submicron structures, such as those having critical dimensions of about 55 nm and beyond.

The inventors have discovered that improvements to the design of heaters utilized to control the temperature of a lid of the processing chamber have a beneficial effect on plasma uniformity.

SUMMARY

Embodiments of the invention generally provide a shielded lid heater. Other embodiments provide a method and apparatus for controlling the lid temperature of a plasma processing chamber. The method and apparatus enhances positional control of plasma location within a plasma processing chamber, and may be utilized in etch, deposition, implant, and thermal processing systems, among other applications where the control of plasma location is desirable.

In one embodiment, a shielded lid heater is provided that includes an aluminum base and RF shield sandwiching a heater element. A thermal insulator is disposed on the RF shield.

In another embodiment, a shielded lid heater is provided that includes an aluminum base, an RF shield and a heater element. The base has a channel formed therein which accommodates heater element. The RF shield covers the channel to enclose the heater element.

In another embodiment, a shielded lid heater includes an inductor coil coupled thereto. The inductor coil may optionally be a variable inductor, thereby enabling the inductance to be tuned to position a plasma with in a processing chamber.

In another embodiment, a plasma processing chamber is provided that includes a chamber body enclosed by a lid, a substrate support disposed in the chamber body, coils positioned adjacent the lid for coupling RF power to gases within the chamber body; and a shielded lid heater coupled to the lid. The lid heater includes an aluminum base and RF shield sandwiching a heater element. Optionally the lid heater may include an inductor coil.

In yet another embodiment, a process for turning a plasma processing chamber is provided that include determining a position of a plasma within the processing chamber, selecting an inductance and/or position of an inductor coil coupled to a lid heater that shifts the plasma location from the determined position to a target position, and plasma processing a substrate with the inductor coil having the selected inductance and/or position.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
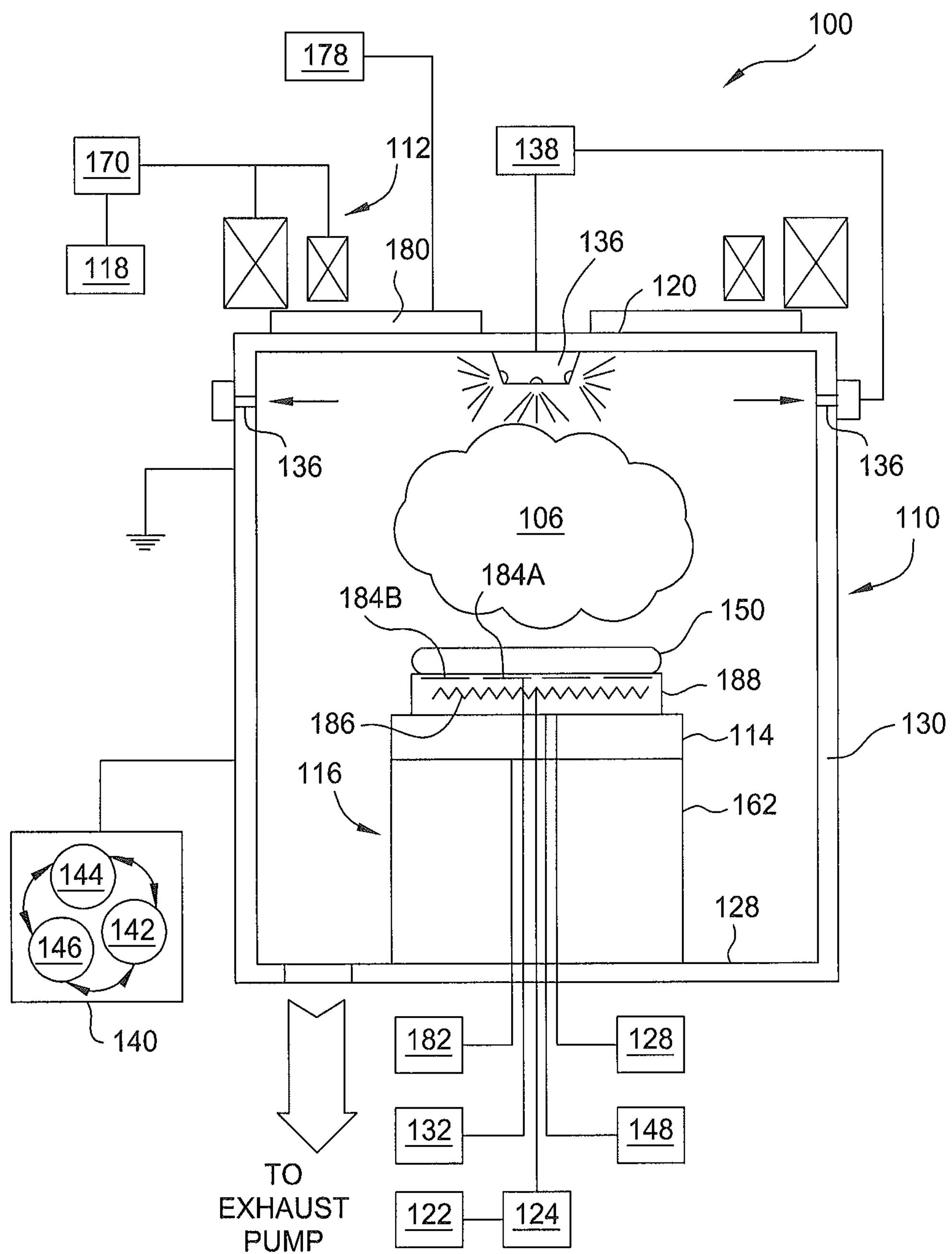
FIG. 1 is a schematic diagram of an exemplary semiconductor substrate processing apparatus comprising a shielded lid heater in accordance with one embodiment of the invention.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

FIG. 1 depicts a schematic diagram of an exemplary plasma processing chamber 100 having one embodiment of a shielded lid heater 180 of the present invention. The particular embodiment of the plasma processing chamber 100 is shown in FIG. 1 as an etch reactor, but is contemplated that the shielded lid heater 180 may beneficially be utilized in other types of plasma processing chambers, including chemical vapor deposition chambers, physical vapor deposition chambers, implantation chambers, nitriding chambers, plasma annealing chambers, plasma treatment chambers, and ashing chambers, among others. Thus, the embodiment of plasma processing chamber of FIG. 1 is provided for illustrative purposes and should not be used to limit the scope of the invention.

Processing chamber 100 generally includes a chamber body 110, a gas panel 138 and a controller 140. The chamber body 110 includes a bottom 128, sidewalls 130 and a lid 120 that enclose a process volume. The sidewalls 130 and bottom 128 are fabricated from a conductive material, such as stainless steel or aluminum. The lid 120 may be fabricated from aluminum, stainless steel, ceramic or other suitable material.

Process gasses from the gas panel 138 are provided to the process volume of the chamber body 110 through a showerhead or one or more nozzles 136. In the embodiment depicted in FIG. 1, the processing chamber 100 includes a plurality of nozzles 136 positioned along the sidewalls 130 of the chamber body and a nozzle 136 centrally mounted below the lid 120. The nozzle 136 mounted in the center of the lid 120 may include independently controllable radial and down-facing gas outlet ports.

The controller 140 includes a central processing unit (CPU) 144, a memory 142, and support circuits 146. The controller 140 is coupled to and controls components of the processing chamber 100, processes performed in the chamber body 110, as well as may facilitate an optional data exchange with databases of an integrated circuit fab.

In the depicted embodiment, the lid 120 is a substantially flat ceramic member. Other embodiments of the process chamber 100 may have other types of ceilings, e.g., a dome-shaped ceiling. Above the lid 120 is disposed an antenna 112 comprising one or more inductor coil elements (two co-axial coil elements are illustratively shown). The antenna 112 is coupled, through a first matching network 170, to a radio-frequency (RF) plasma power source 118. During plasma processing, the antenna 112 is energized with RF power provided by the power source 118 to maintain a plasma 106 formed from the process gasses within in the internal volume of the chamber body 110.

In one embodiment, the substrate pedestal assembly 116 includes a mount assembly 162, a base assembly 114 and an electrostatic chuck 188. The mount assembly 162 couples the base assembly 114 to the bottom 128 of the chamber body 110.

The electrostatic chuck 188 is generally formed from ceramic or similar dielectric material and comprises at least one clamping electrode 186 controlled using a power supply 128. In a further embodiment, the electrostatic chuck 188 may comprise at least one RF electrode (not shown) coupled, through a second matching network 124, to a power source 122 of substrate bias. The electrostatic chuck 188 may optionally comprise one or more substrate heaters. In one embodiment, two concentric and independently controllable resistive heaters, shown as concentric heaters 184A, 184B, are utilized to control the edge to center temperature profile of the substrate 150.

The electrostatic chuck 188 may further comprise a plurality of gas passages (not shown), such as grooves, that are formed in the substrate supporting surface of the chuck and fluidly coupled to a source 148 of a heat transfer (or backside) gas. In operation, the backside gas (e.g., helium (He)) is provided at controlled pressure into the gas passages to enhance the heat transfer between the electrostatic chuck 188 and the substrate 150. Conventionally, at least the substrate supporting surface of the electrostatic chuck is provided with a coating resistant to the chemistries and temperatures used during processing the substrates.

The base assembly 114 is generally formed from aluminum or other metallic material. The base assembly 114 includes one or more cooling passages that are coupled to a source 182 of a heating or cooling liquid. A heat transfer fluid, which may be at least one gas such as Freon, Helium or Nitrogen, among others, or a liquid such as water or oil, among others, is provided by the source 182 through the passages to control the temperature of the base assembly 114, thereby heating or cooling the base assembly 114, thereby controlling, in part, the temperature of a substrate 150 disposed on the base assembly 114 during processing.

Temperature of the pedestal assembly 116, and hence the substrate 150, is monitored using a plurality of sensors (not shown in FIG. 1). Routing of the sensors through the pedestal assembly 116 is further described below. The temperature sensors, such as a fiber optic temperature sensor, are coupled to the controller 140 to provide a metric indicative of the temperature profile of the pedestal assembly 116.

Temperature of the lid 120 is controlled by the shielded lid heater 180. In one embodiment, the shielded lid heater 180 is a resistive heater energized by a power source 178. In embodiments wherein the lid 120 is fabricated from a ceramic material, the shielded lid heater 180 may be adhered or clamped to the exterior surface of the lid 120.

Figure 2A:
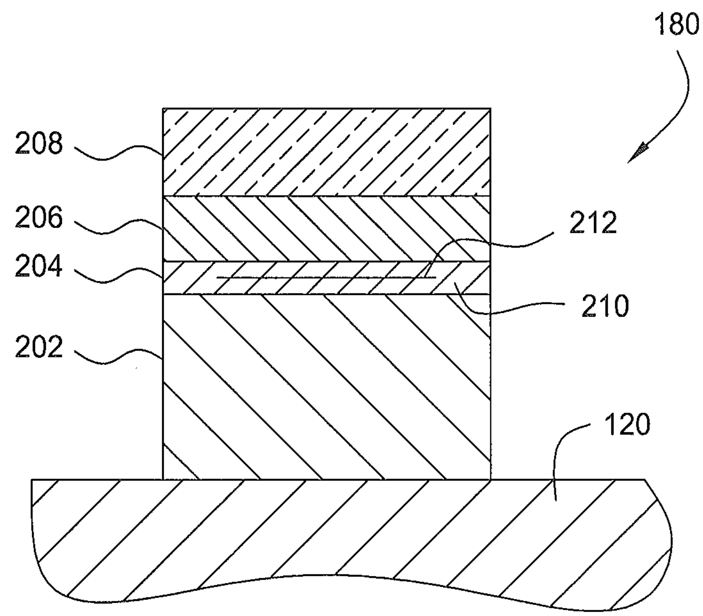
FIGS. 2A-B are a schematic cross-sectional views of two embodiments of a shielded lid heater.

FIG. 2A is a partial cross-sectional view of one embodiment of the shielded lid heater 180 disposed on the lid 120. The shielded lid heater 180 generally includes a conductive base 202, a heater element 204 and an RF shield 206. The heater element 204 is sandwiched between the conductive base 202 and the RF shield 206. The heater element 204 generally includes a resistive element 212 embedded in an electrical insulator 210. The RF shield 206 substantially prevents the resistive element 212 from influencing the orientation of the magnetic and electrical field lines generated by the antenna 112 passing through the lid 220 so that the plasma 106 may be more accurately positioned within the interior volume of the chamber body 110.

The conductive base 202 generally has sufficient mass to provide uniform heat transfer between the heater element 204 and the lid 120. In one embodiment, the conductive base 202 is fabricated from a metallic material having good heat transfer characteristics, such as aluminum and the like. The conductive base 202 may have a geometric form suitable to provide a desired heat distribution to the lid 220.

The RF shield 206 is generally fabricated from a metallic material such as aluminum. The RF shield 206 may be aluminum foil or plate. In one embodiment, the RF shield 206 has the same plan form as the conductive base 202.

Optionally, a thermal insulator 208 may be disposed on the RF shield 206. The thermal insulator 208 is generally fabricated from a material which has little influence on the RF magnetic and electrical fields, such as a high temperature elastomer, such as a silicone or other high temperature foam. The thermal insulator 208 provides protection from burns that may be received if the lid heater 180 is inadvertently touched while at a high temperature.

The conductive base 202, heater element 204 and RF shield 206 may be secured using fasteners, clamped together or held by a suitable adhesive. In one embodiment, the components of the shielded lid heater 180 are secured together utilizing a high temperature epoxy.

Figure 2B:
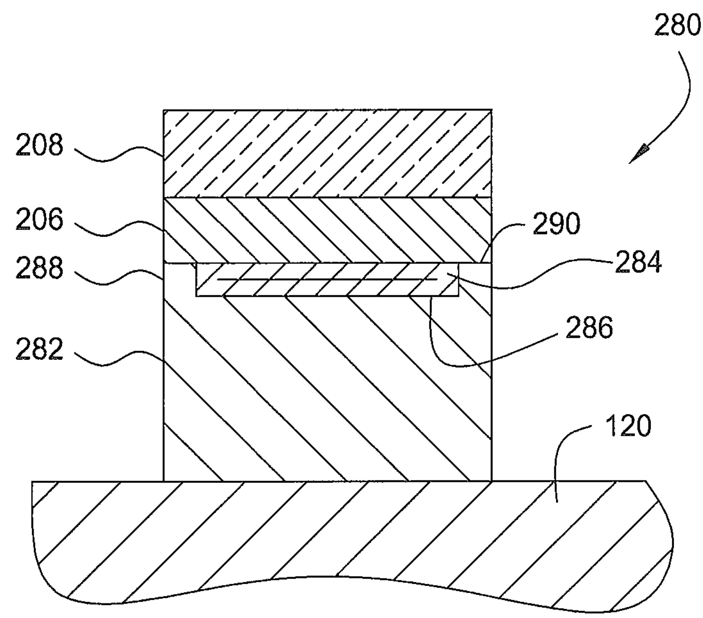

FIG. 2B is a schematic cross-sectional view of another embodiment of a shielded lid heater 280 which may be utilized in the chamber 100. The shielded lid heater 280 generally includes a conductive base 282, a heater element 284 and a RF shield 206. An optional thermal insulator 208 may be disposed on the RF shield 206. The heater element 284 is configured as described above with reference to the heating element 204 of FIG. 2A. The conductive base 282 is substantially similar to the conductive base 202 described above, with the addition of a channel 286 formed in a top surface 290. The channel 286 is sized to accommodate the heater element 284. The sidewalls 288 of the channel 286 have a height sufficient such that the heater element 284 is enclosed within the channel 286 when the RF shield 206 is disposed on the top surface 290 of the conductive base 282.

Figure 3:
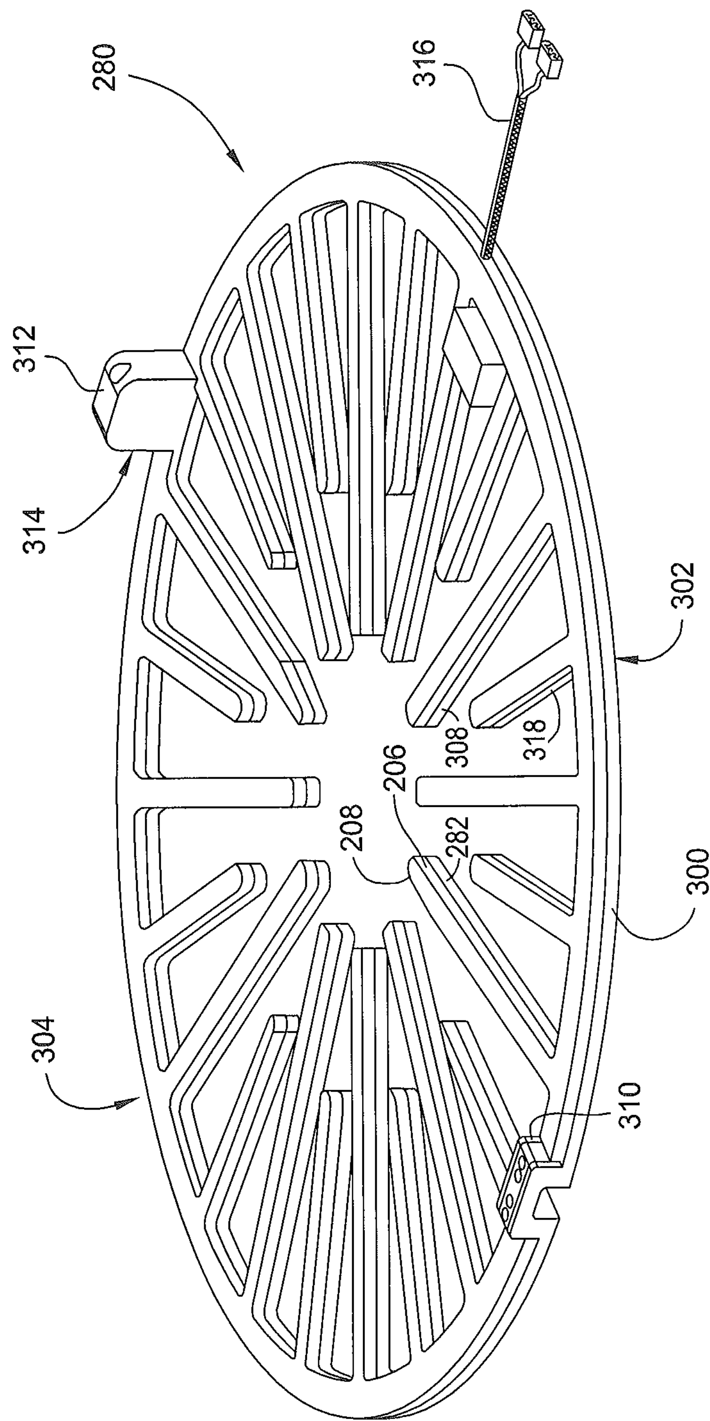
FIG. 3 is an isometric view of one embodiment of the shielded lid heater of FIG. 1.

FIG. 3 depicts an isometric view of the shielded lid heater 280. The shielded lid heater 280 generally includes a first section 302 and a second section 304. Each section comprises an annular member 300 and a plurality of fingers 308, 318. The fingers 308, 318 extend radially inward from the annular member 300. The annular members 300 of the sections 302, 304 have the same radial dimension, such that when coupled together, the sections 302, 304 form a generally circular plan form. The fingers 318 are generally shorter than the fingers 308 and are interweaved between adjacent fingers 308 to form a spoke-like pattern.

The first and second sections 302, 304 are coupled by at least one bridge connector 310. In the embodiment depicted in FIG. 3, two bridge connectors 310, 312 are illustrated. In one embodiment, at least one of the bridge connectors, such the bridge connector 312, may include an inductor coil 314. At least one of the bridge connectors 310, 312 couples the heater elements 284 disposed in each section 304, 302, such that a single lead 316 may be utilized to couple the shielded lid heater 280 to the power source 178.

Figure 4:
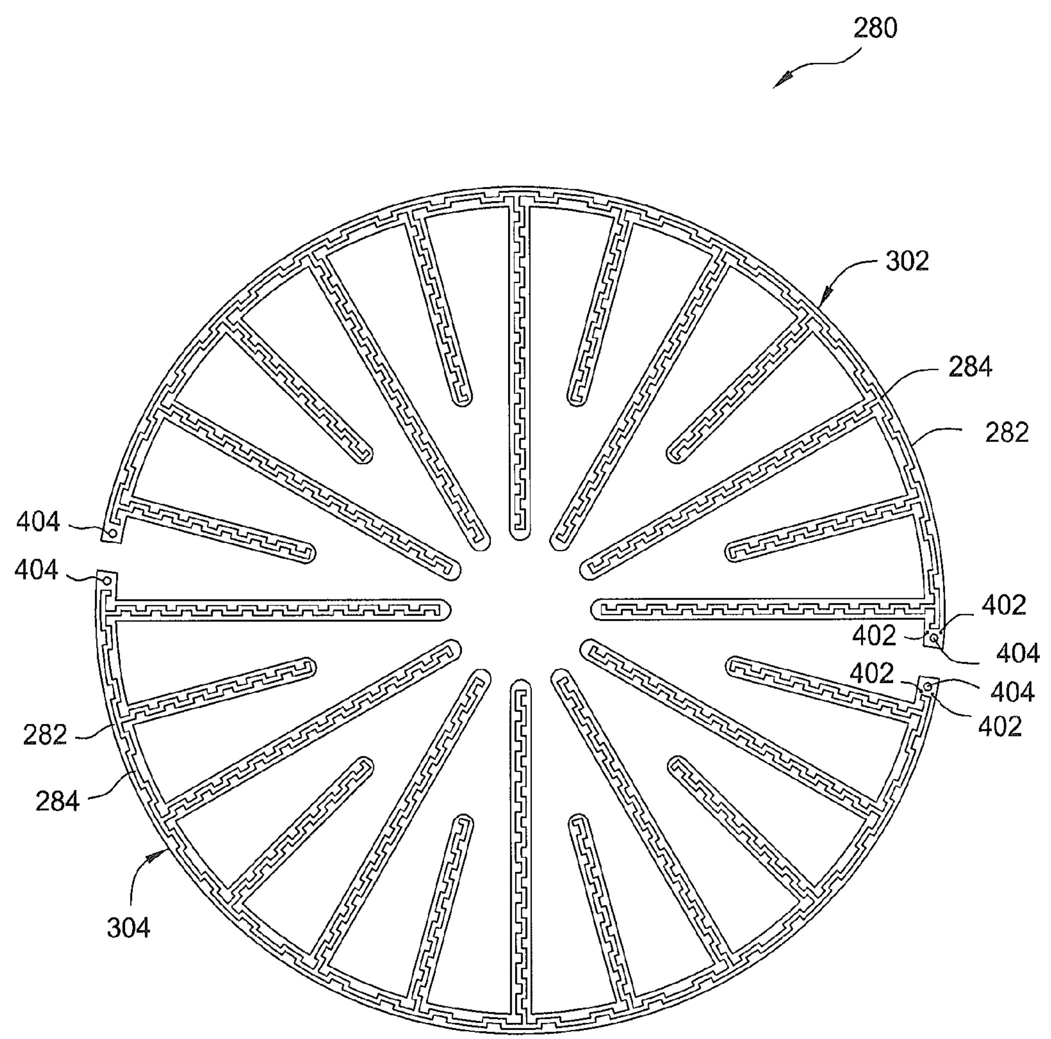
FIG. 4 is a top view of one embodiment of the shielded lid heater of FIG. 1.

FIG. 4 depicts a top view of the shielded lid heater 280 with the RF shield 206 removed to expose the heater element 284. As shown, the heater element 284 may be stepped along its path so that a greater density of heating capacity is provided. The ends of the heater element 284 include contacts 402 to facilitate coupling of the heater elements of each section 302, 304, as discussed further below. Also illustrated in FIG. 4 are threaded holes 404 formed in the conductive base 282 to facilitate fastening of the bridge connectors 310, 312.

Figure 5:
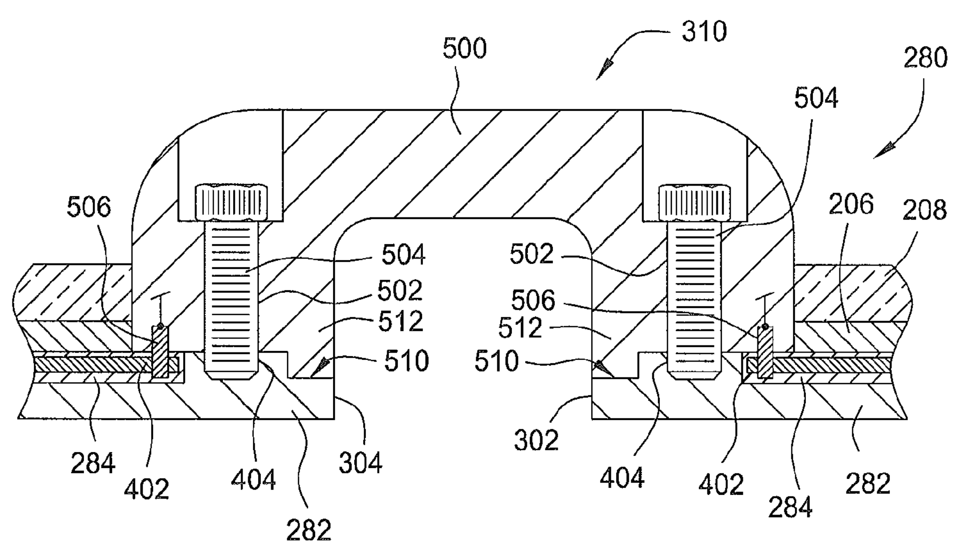
FIG. 5 is a partial front side view of one embodiments of a shielded lid heater.

FIG. 5 is a partial front view of one embodiment of the shielded lid heater 280 illustrating the bridge connector 310. The bridge connector 310 generally includes a body 500 having a plurality of holes 502 which accommodate fasteners 504. The fasteners 504 engage the threaded holes 404 formed in the conductive base 282, thereby securing the sections 302, 304 together. The sections 302, 304 may include a step 510 which engages with a tab 512 to locate the body 500 relative to the conductive bases 282 in a predefined orientation.

The bridge connector 310 additionally includes a plurality of pins 506 which project therefrom. The pins 506 are configured to electrically connect the contacts 402 formed at the end of the heater elements 284. Although not shown in FIG. 5, the pins 506 couple the resistive elements of each heater elements 284 disposed in each of the portions 302, 304 through the body 500.

Optionally, the body 500 may be comprised of a conductive material which electrically couples the bases 282 of the sections 302, 304. Alternatively, the body 500 may be fabricated from an insulator.

Figure 6:
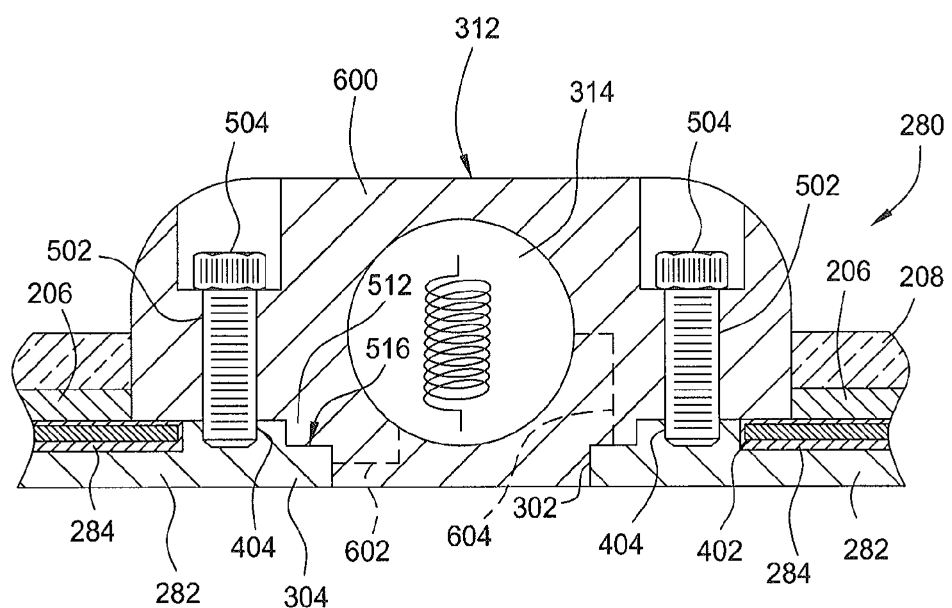
FIG. 6 is a partial back side view of one embodiments of a shielded lid heater.

FIG. 6 depicts one embodiment of the bridge connector 312. The bridge connector 312 is coupled to the sections 302, 304 of the shielded lid heater 280 as described above. Also as discussed above, the bridge connector 312 includes an inductor coil 314. The inductor coil 314 may be sized to provide an inductance tailored to influence the magnetic and electric fields within the chamber in order to produce a desired effect on the plasma 106. In one embodiment, the inductor 314 is a variable inductor to allow tuning of the inductance value between process runs or in situ processing. The inductor coil 314 may be isolated from the conductive bases 282, or alternatively electrically couple the bases 282 through leads 602, 604.

A body 600 of the bridge connector 312 may be conductive as to electrically couple the conductive bases 282 of the sections 302, 304. Alternatively, the body 600 of the bridge connector may be fabricated from a dielectric material to electrically insulate the sections 302, 304.

Figure 7:
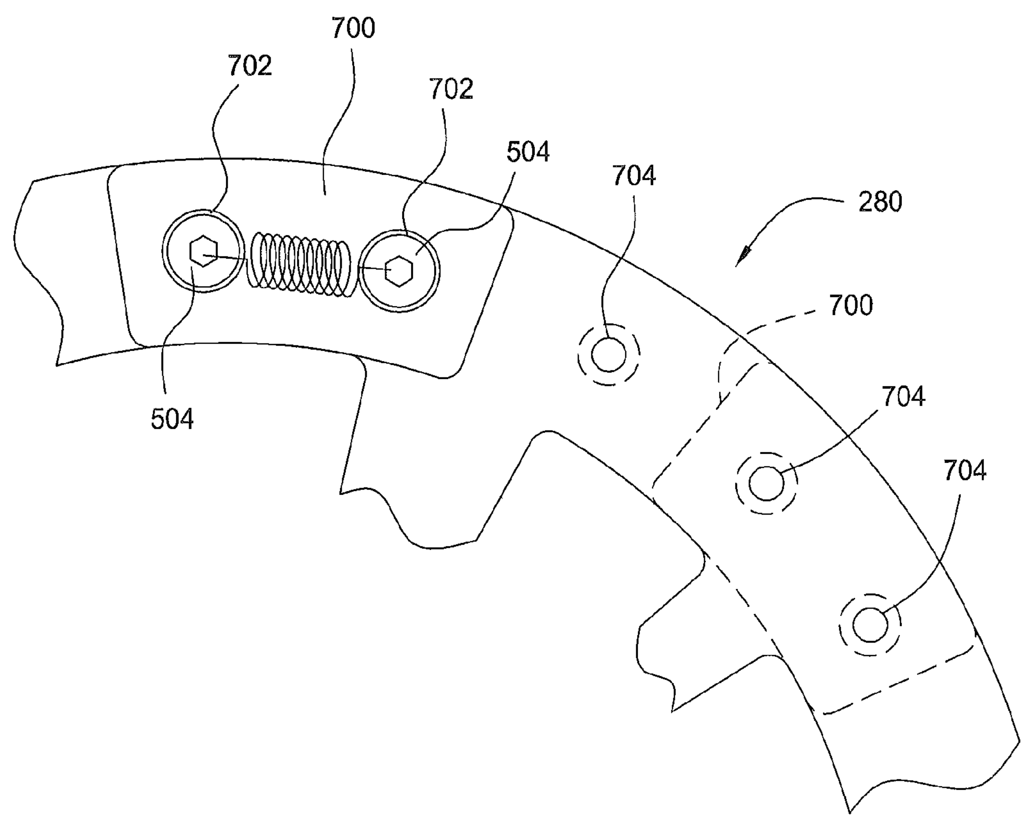
FIG. 7 is a partial side view of another embodiment of a shielded lid heater.

FIG. 7 is a partial top view of another embodiment of a shielded lid heater 780. The shielded lid heater 780 is generally configured similar to the heaters 180, 280 described above, with the addition of a repositionable inductor 700. The shielded lid heater 780 includes a plurality of mounting holes 702 which allow the inductor 700 may be fastened at any number of locations. Thus, the position of the inductor 700 along the shielded lid heater 780 may be changed as needed to suit processes needs by securing the inductor 700 to a different set of mounting holes 702.

In one embodiment, the inductor 700 may be electrically isolated from the shielded lid heater 780. In one embodiment, the inductor 700 may be electrically coupled to the conductive base of the shielded lid heater 780 either through contact pins, mounting fasteners or other suitable manner.

Figure 8:
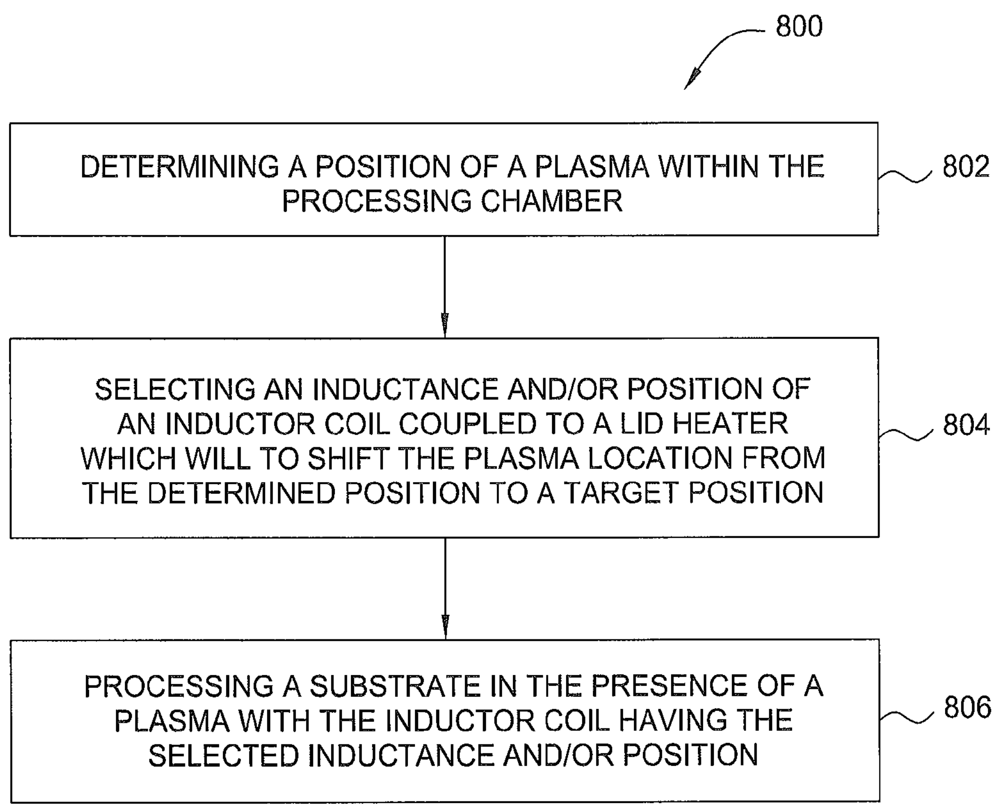
FIG. 8 is a flow diagram of one embodiment of a method for plasma processing a substrate.

FIG. 8 is a block flow diagram of a method 800 for plasma processing a substrate in a processing chamber equipped with a shielded lid heater. The method 800 begins by determining a position of a plasma within the processing chamber at 802. The plasma position may be determined by measuring a characteristic of the plasma, by optical methods, utilizing sensors, empirical dates, examination of processing results, modeling or other suitable manner. At 804, an inductance and/or position of an inductor coil coupled to a lid heater is selected which will to shift the plasma location from the determined position to a target position. At 806, the substrate is processed in the presence of a plasma with the inductor coil having the selected inductance and/or position. The process performed on the substrate may be selected from the group consisting of etching, chemical vapor deposition, physical vapor deposition, implanting, nitriding, annealing, plasma treating, and ashing, among other plasma processes.

Thus, a lid heater has been provided that enhances positioning of the plasma within a processing chamber. As the plasma can be positioned in a more desirable location, more uniform and predictable processing requests may be realized.

While the foregoing is directed to embodiments of the present invention, other and further embodiments of the invention may be devised without departing from the basic scope thereof, and the scope thereof is determined by the claims that follow.

What is claimed is:

1. A plasma processing chamber comprising:

a chamber body;

a lid enclosing an interior volume of the chamber body;

a substrate support disposed in the interior volume;

coils positioned adjacent the lid for coupling RF power to gases within the chamber body; and a shielded lid heater coupled to the lid, wherein the lid heater further comprises:

a thermally conductive base disposed in contact with the lid;

a heater element; and an RF shield sandwiching the heater element with the thermally conductive base, wherein the thermally conductive base of the shielded lid heater, further comprises: a first section and a second section, wherein the first and second sections of the thermally conductive base include a plurality of fingers forming a spoke-like pattern.

2. The plasma processing chamber of claim 1, wherein the shielded lid heater further comprises:

an inductor coil coupled to the thermally conductive base.

3. The plasma processing chamber of claim 2, wherein the inductor coil is repositionable along the thermally conductive base.

4. The plasma processing chamber of claim 2, wherein the inductor coil is a variable inductor.

5. The plasma processing chamber of claim 1, wherein the thermally conductive base comprises:

a channel housing the heater element.

6. The plasma processing chamber of claim 1, wherein the heater element comprises:

a first heater circuit disposed on a first section of the thermally conductive base; and a second heater circuit disposed on a second section of the thermally conductive base, wherein the first and second heater circuits are coupled by a connector bridging the first and second sections of the thermally conductive base.

7. The plasma processing chamber of claim 1, wherein the plurality of fingers forming a spoke-like pattern comprises:

interleaved fingers of different length.

8. A plasma processing chamber comprising:

a chamber body;

a lid enclosing an interior volume of the chamber body;

a substrate support disposed in the interior volume;

coils positioned adjacent the lid for coupling RF power to gases within the chamber body; and a shielded lid heater coupled to the lid, wherein the lid heater further comprises:

a plurality of fingers forming a spoke-like pattern; and an RF shield disposed on the fingers.

9. The plasma processing chamber of claim 8, wherein the shielded lid heater further comprises:

a first heater circuit configured to heat a first section of a thermally conductive base; and a second heater circuit configured to heat a second section of the thermally conductive base, wherein the first and second heater circuits are coupled by a connector bridging the first and second sections of the thermally conductive base.

10. The plasma processing chamber of claim 9, wherein the shielded lid heater further comprising:

a thermal insulator disposed on the RF shield.

11. The plasma processing chamber of claim 9, wherein the plurality of fingers forming a spoke-like pattern comprises:

interleaved fingers of different length.

12. The plasma processing chamber of claim 9, wherein the first section is separate and disconnectable from the second section.

13. The plasma processing chamber of claim 9, wherein the shielded lid heater further comprises:

an inductor coil.

14. The plasma processing chamber of claim 13, wherein the inductor coil is repositionable along the thermally conductive base supporting the fingers.

15. The plasma processing chamber of claim 13, wherein the inductor coil is a variable inductor.

* * * * *